(12) United States Patent
Mann et al.

(10) Patent No.: US 9,029,956 B2
(45) Date of Patent: May 12, 2015

(54) SRAM CELL WITH INDIVIDUAL ELECTRICAL DEVICE THRESHOLD CONTROL

(75) Inventors: Randy W. Mann, Milton, NY (US); Scott D. Luning, Poughkeepsie, NY (US)

(73) Assignee: Global Foundries, Inc., Grand Cayman (KY)

( * ) Notice: Subject to any disclaimer, the term of this patent is extended or adjusted under 35 U.S.C. 154(b) by 817 days.

(21) Appl. No.: 13/282,299

(22) Filed: Oct. 26, 2011

(65) Prior Publication Data

US 2013/0107610 A1 May 2, 2013

(51) Int. Cl.
| | |
|---|---|
| *H01L 27/11* | (2006.01) |
| *G11C 11/00* | (2006.01) |
| *H01L 27/02* | (2006.01) |
| *G11C 11/412* | (2006.01) |

(52) U.S. Cl.
CPC .......... *H01L 27/0207* (2013.01); *G11C 11/412* (2013.01); *H01L 27/1104* (2013.01); *Y10S 257/903* (2013.01)

(58) Field of Classification Search
CPC .... H01L 27/11; H01L 27/1104; G11C 5/025; G11C 11/41; G11C 11/412
USPC .................. 257/369, 401, 402, 903, E21.661, 257/E27.098; 365/51, 154, 156
See application file for complete search history.

(56) References Cited

U.S. PATENT DOCUMENTS

| | | | |
|---|---|---|---|
| 5,045,717 A | 9/1991 | Moen, Jr. et al. | |
| 5,111,255 A | 5/1992 | Kiely et al. | |
| 5,142,349 A | 8/1992 | Zhu et al. | |
| 5,148,393 A | 9/1992 | Furuyama | |
| 5,164,805 A | 11/1992 | Lee | |
| 5,179,535 A | 1/1993 | Nakayama | |
| 5,227,697 A | 7/1993 | Sakagami | |
| 5,243,206 A | 9/1993 | Zhu et al. | |
| 5,248,626 A | 9/1993 | Nguyen et al. | |
| 5,280,455 A | 1/1994 | Kanaishi | |
| 5,292,676 A | 3/1994 | Manning | |
| 5,306,650 A | 4/1994 | O'Mara, Jr. et al. | |
| 5,317,433 A | 5/1994 | Miyawaki et al. | |
| 5,319,604 A | 6/1994 | Imondi et al. | |

(Continued)

OTHER PUBLICATIONS

R.W.Mann, "Interactions of Technology and Design in Nanoscale SRAM", Ph.D. Dissertation, Dec. 2010.

(Continued)

*Primary Examiner* — Allison P Bernstein
(74) *Attorney, Agent, or Firm* — Ingrassia Fisher & Lorenz, P.C.

(57) ABSTRACT

A static random access memory cell is provided that includes first and second inverters formed on a substrate each having a pull-up and pull-down transistor configured to form a cell node. Each of the pull-down transistors of the first and second inverters resides over first regions below the buried oxide layer and having a first doping level and applied bias providing a first voltage threshold for the pull-down transistors. A pair of passgate transistors is coupled the cell nodes of the first and second inverters, and each is formed over second regions below the buried oxide layer and having a second doping level and applied bias providing a second voltage threshold for the passgate transistors. The first voltage threshold differs from the second voltage threshold providing electrical voltage threshold control between the pull-down transistors and the passgate transistors.

19 Claims, 6 Drawing Sheets

(56) References Cited

U.S. PATENT DOCUMENTS

| | | | |
|---|---|---|---|
| 5,385,854 A | 1/1995 | Batra et al. | |
| 5,448,198 A | 9/1995 | Toyoshima et al. | |
| 5,451,889 A | 9/1995 | Heim et al. | |
| 5,461,338 A | 10/1995 | Hirayama et al. | |
| 5,486,774 A | 1/1996 | Douseki et al. | |
| 5,502,629 A | 3/1996 | Ito et al. | |
| 5,583,457 A | 12/1996 | Horiguchi et al. | |
| 5,614,847 A | 3/1997 | Kawahara et al. | |
| 5,646,900 A | 7/1997 | Tsukude et al. | |
| 5,734,185 A | 3/1998 | Iguchi et al. | |
| 5,753,938 A | 5/1998 | Thapar et al. | |
| 5,789,967 A | 8/1998 | Katoh | |
| 5,818,084 A | 10/1998 | Williams et al. | |
| 5,821,796 A | 10/1998 | Yaklin et al. | |
| 5,834,814 A | 11/1998 | Ito | |
| 5,852,375 A | 12/1998 | Byrne et al. | |
| 5,880,604 A | 3/1999 | Kawahara et al. | |
| 5,883,544 A | 3/1999 | So et al. | |
| 5,907,789 A | 5/1999 | Komatsu | |
| 5,909,400 A | 6/1999 | Bertin et al. | |
| 5,909,618 A | 6/1999 | Forbes et al. | |
| 5,914,511 A | 6/1999 | Noble et al. | |
| 5,926,412 A | 7/1999 | Evans, Jr. et al. | |
| 5,939,762 A * | 8/1999 | Lien | 257/391 |
| 5,963,469 A | 10/1999 | Forbes | |
| 5,986,924 A | 11/1999 | Yamada | |
| 6,043,536 A | 3/2000 | Numata et al. | |
| 6,075,404 A | 6/2000 | Shindoh et al. | |
| 6,087,193 A | 7/2000 | Gray | |
| 6,232,793 B1 | 5/2001 | Arimoto et al. | |
| 6,248,636 B1 | 6/2001 | Park | |
| 6,252,452 B1 | 6/2001 | Hatori et al. | |
| 6,274,887 B1 | 8/2001 | Yamazaki et al. | |
| 6,340,830 B1 | 1/2002 | Takemura | |
| 6,433,609 B1 | 8/2002 | Voldman | |
| 6,456,157 B1 | 9/2002 | Forbes et al. | |
| 6,462,585 B1 | 10/2002 | Bernstein et al. | |
| 6,534,822 B1 | 3/2003 | Xiang et al. | |
| 6,573,549 B1 * | 6/2003 | Deng et al. | 257/296 |
| 6,847,542 B2 * | 1/2005 | Yabe | 365/154 |
| 6,919,647 B2 | 7/2005 | Hackler, Sr. et al. | |
| 7,532,501 B2 | 5/2009 | Joshi et al. | |
| 7,639,525 B2 * | 12/2009 | Yamaoka et al. | 365/154 |
| 8,552,500 B2 * | 10/2013 | Dennard et al. | 257/350 |
| 2004/0007785 A1 * | 1/2004 | Okada | 257/903 |
| 2004/0125681 A1 | 7/2004 | Yamaoka et al. | |
| 2005/0017377 A1 | 1/2005 | Joshi et al. | |
| 2005/0130358 A1 | 6/2005 | Chidambarrao et al. | |
| 2005/0218427 A1 | 10/2005 | Joshi et al. | |
| 2005/0276094 A1 * | 12/2005 | Yamaoka et al. | 365/154 |
| 2006/0232321 A1 | 10/2006 | Chuang et al. | |
| 2011/0157965 A1 * | 6/2011 | Nii | 365/156 |
| 2011/0233675 A1 * | 9/2011 | Mazure et al. | 257/347 |
| 2011/0317485 A1 * | 12/2011 | Liaw | 365/182 |
| 2012/0299105 A1 * | 11/2012 | Cai et al. | 257/348 |
| 2013/0107608 A1 * | 5/2013 | Mann et al. | 365/154 |
| 2013/0175594 A1 * | 7/2013 | Basker et al. | 257/301 |

OTHER PUBLICATIONS

R.W.Mann and B.H.Calhoun, "New category of ultra-thin notchless 6T SRAM cell layout topologies for sub-22nm", In Proc. 12th International symposium on quality electronic design, ISQED 2011.

* cited by examiner

SRAM CELL WITH INDIVIDUAL ELECTRICAL DEVICE THRESHOLD CONTROL

TECHNICAL FIELD

The technical field relates to semiconductor devices and to methods for their fabrication, and more particularly, relates to static random access memory (SRAM) cells having individual electrical threshold control for the NFET devices of an SRAM cell or an SRAM array.

BACKGROUND

The majority of present day integrated circuits (ICs) are implemented by using a plurality of interconnected field effect transistors (FETs). A FET includes a gate electrode as a control electrode and spaced apart source and drain regions formed in a semiconductor substrate and between which a current can flow. A control voltage applied to the gate electrode controls the flow of current through a channel between the source and drain regions. Depending upon doping during the fabrication processes a FET can be an n-channel device (NFET) or a p-channel device (PFET).

One of the most important semiconductor circuits is the static random access memory (SRAM) cell used in many demanding memory applications. A six-transistor (6T) SRAM cell includes two PFETs for pull-up operation, two NFETs for pull-down, and two NFETs for input/output (i.e., passgate or transfer) access. However, conventional layouts (topologies) for a 6T SRAM cell typically share the active regions of the NFET passgate devices with the NFET pull-down devices. Such a topology does not accommodate individual electrical device threshold control, and therefore, prevents conventional topologies from gaining the advantages offered by individual electrical threshold control of the NFET devices.

Accordingly, a need exists to provide methods for fabricating an SRAM cell that provides individual electrical threshold control for the NFET devices. Additionally it is desirable to fully exploit the advantages of individual electrical device threshold control for superior SRAM performance. Furthermore, other desirable features and characteristics of the present invention will become apparent from the subsequent detailed description and the appended claims, taken in conjunction with the accompanying drawings and the foregoing technical field and background.

BRIEF SUMMARY

In accordance with one embodiment, a static random access memory cell includes first and second inverters formed in a silicon layer on a substrate each having a pull-up and pull-down transistor configured to form a cell node. Each of the pull-down transistors of the first and second inverters resides over first regions of the substrate having a first doping level and applied voltage providing a first voltage threshold for the pull-down transistors. A pair of passgate transistors is coupled to the cell nodes of the first and second inverters, and each is formed over second regions of the substrate having a second doping level and applied voltage providing a second voltage threshold for the passgate transistors. The first voltage threshold differs from the second voltage threshold providing voltage threshold control between the pull-down transistors and the passgate transistors.

In accordance with another embodiment, a static random access memory cell includes a pair of P channel field effect transistors (PFET) each having a common source connected to a voltage potential and a gate connected to a drain of the other PFET. Also included is a first pair of N channel field effect transistors (NFET) formed in a silicon layer and over a first substrate doping level, each having a drain connected to the drain of the respective PFET of the pair of PFETs, a common source connected to a reference potential, and a gate connected to the drain of an opposite PFET of the pair of PFETs. A second pair of NFETs resides over a second substrate doping level and has a drain respectively connected to a cell node linking the respective drain of the NFET of the first pair of NFETs to the drain of the PFET of the pair of PFETs. The first substrate doping level and voltage applied to that layer provides a first voltage threshold for the first pair of NFETs while the second substrate doping level and voltage applied to that layer provides a second voltage threshold for the second pair of NFETs that is different from the first voltage threshold.

In accordance with yet another embodiment, a method of fabricating a static random access memory cell begins by forming a first P channel field effect transistor (PFET) over an N-well area of a substrate and forming a first N channel field effect transistor (NFET) over a region of the substrate having a first doping level below an insulating layer substantially covering the substrate. The first PFET and the first NFET have a first shared contact and a first common gate that forms a first inverter of the static random access memory cell. Next, a second PFET is formed over the N-well area of the substrate and a second NFET is formed over another region of the substrate having the first doping level below the insulating layer. The second PFET and the second NFET also have a second shared contact and a second common gate forming a second inverter cross-coupled to the first inverter. Finally, a pair of passgate transistors is formed in linear alignment to one of the first and second NFETs and over second regions of the substrate having a second doping level below the buried oxide layer. Each of the pair of passgate transistors is coupled to one of the first shared contact or the second shared contact to form the static random access memory cell.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

The following description may refer to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the schematics depict example arrangements of elements, additional intervening elements, devices, features, modules or components may be present in an embodiment of the invention (assuming that the functionality of the system is not adversely affected).

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor transistor devices are well known and so, in the interest of brevity, many conventional steps will only be mentioned briefly herein or will be omitted entirely without providing the well known process details.

Figure 1:
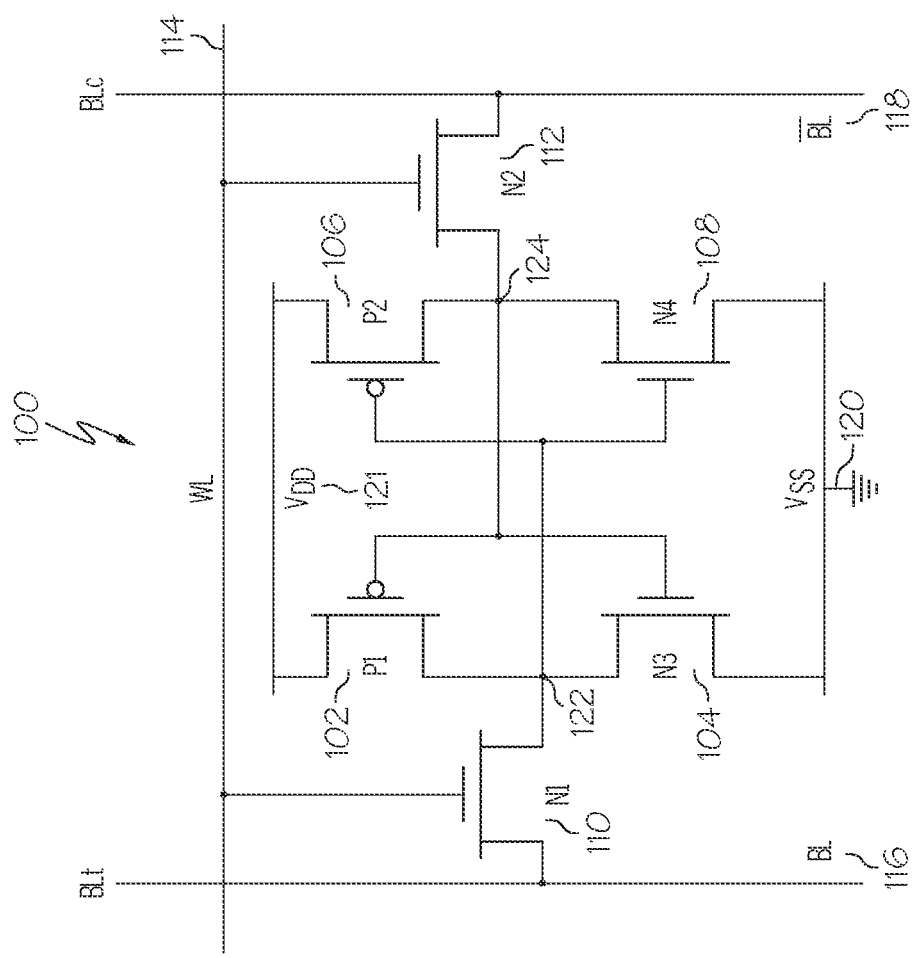
FIG. 1 is a schematic diagram of a 6T SRAM cell.

A common 6T SRAM cell 100 schematic diagram is shown in FIG. 1. Generally, an SRAM cell is made up of a latch circuit (as the memory portion) and an access circuit for writing information (a bit) into the latch or reading information from the latch. The latch is formed by a pull-up PFET 102 and pull-down NFET 104, which form an inverter that is cross-coupled with another inverter formed by pull-up PFET 106 and pull-down NFET 108. NFET 110 and NFET 112 are the passgate (access) devices that control reading from and writing into the SRAM cell 100. As illustrated in FIG. 1, the passgate transistors 110 and 112 are coupled at either a source or drain contact to the inverters at a shared contact point (122 and 124 respectively) that form cell nodes of the SRAM cell 100. To form an SRAM array, multiple (often hundreds of millions) SRAM cells 100 are arranged in rows and columns with the cells of the same row sharing one word line (WL) 114 (which connects to a gate contact of all the passgates of that row), while cells of the same column share the same complementary bit line (BL) pair of BLt 116 and BLc (the logical compliment of BLt) 118 (which connects to the opposite of the source or drain contact of each passgate coupled to the shared contact point).

During standby, the WL 114 is at logic low (i.e., ground or a reference potential (VSS) 120) and the bit lines (116 and 118) are biased to a logic high level. The passgate devices NFET 110 and NFET 112 are shut off because the WL is biased to VSS (logical low). A logical 1 is maintained in the SRAM cell 100 with PFET 102 and NFET 108 ON (i.e., conducting) and PFET 106 and NFET 104 being in an OFF state. This causes cell node 122 to be at logic high (i.e., VDD) while cell node 124 is at logic low (i.e., ground). Conversely, a logical 0 is maintained in the SRAM cell 100 when PFET 106 and NFET 104 are ON, and PFET 102 and NFET 108 are OFF, which forces the cell node 124 to logic high and the cell node 122 to logic low.

During a read operation, either BLt 116 or BLc 118 is pulled down from its pre-charged logic high level upon activation of the selected word line 114, which causes the NFET passgates (110 and 112) to conduct. BLt 116 is pulled down if the cell is at logical 0, whereas BLc 118 is pulled down if the cell is at logical 1. The voltage differential between BLt and BLc is generated by the state of the cell being read and is amplified by sense amplifiers (not shown in FIG. 1). The sense amplifiers detect this small voltage difference between BLt and BLc, and generate the digital (1's or 0's) signals for external circuitry requesting the memory read operation. Also, either a logic 1 or logic 0 can be stored in (or written to) the SRAM cell 100 during a write operation. To write a logic 1, the WL is driven high, BLt 116 is driven to high and BLc 118 to low. Passgate 112 (N2) passes the logical 0 onto cell node 124, which shuts OFF NFET 104 and turns on PFET 102 so that a 1 is stored on cell node 122. Conversely, to write a logic 0, BLt 116 is forced to low and BLc 118 to high.

Figure 2:
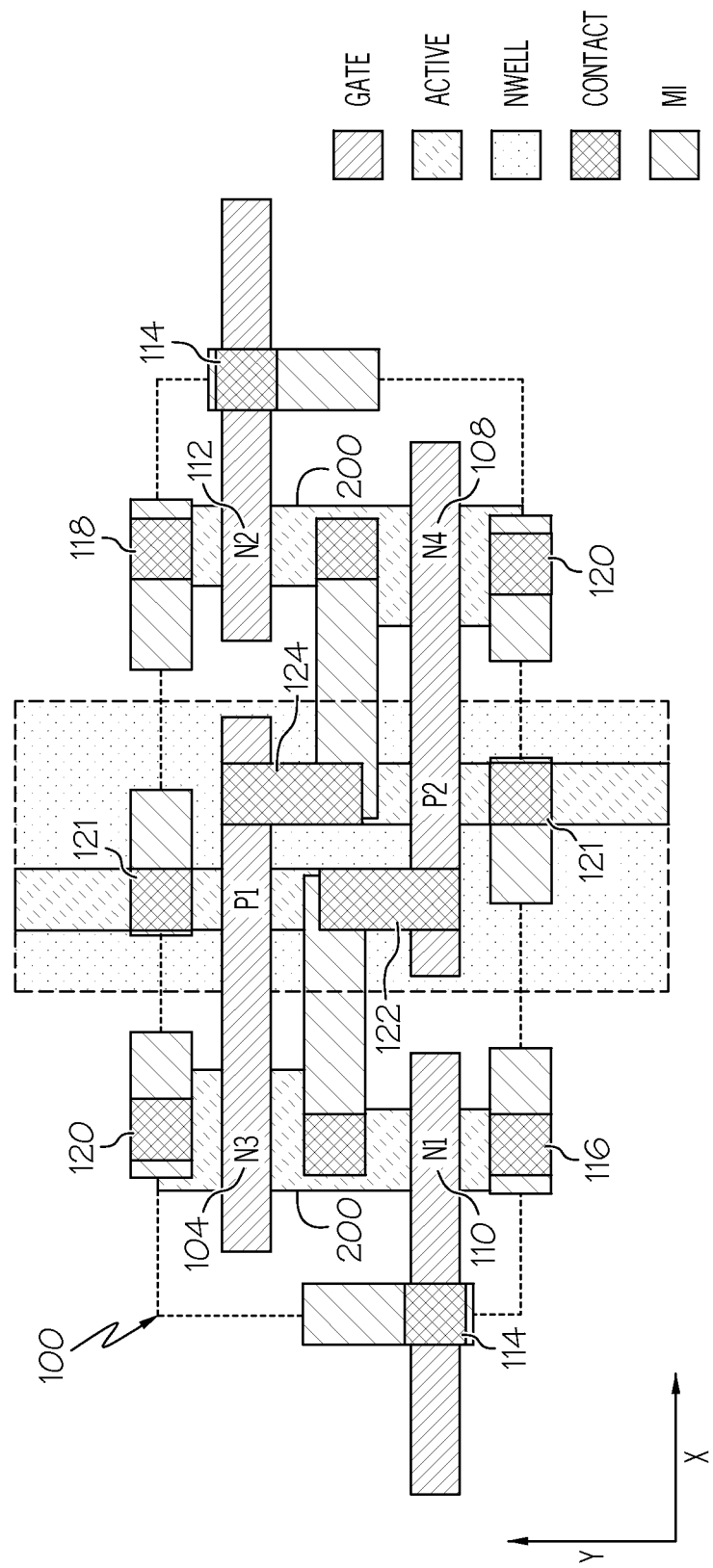
FIG. 2 is a layout view illustrating a conventional topology for the 6T SRAM cell of FIG. 1.

Referring to FIG. 2, a conventional layout (topology) for the SRAM cell 100 is shown. To facilitate understanding, like reference numerals for the schematic layout of FIG. 1 are provided. The topology illustrated in FIG. 2 has arguably been the preferred industry layout for SRAM cells for 65 nm (and below) geometries. However, the active regions 200 of the NFET passgates (110 and 112) and the NFET pull-downs (104 and 108) are shared or merged on the substrate. Moreover, the active regions 200 will fall in the same alignment as a back-plane strip that would be oriented vertically when the SRAM cell 100 is placed in a full memory array. Accordingly, this topology does not facilitate independently varying the back-gate biases of the passgate transistors and the pull-down transistors to achieve the advantages afforded by the present disclosure.

Figure 3:
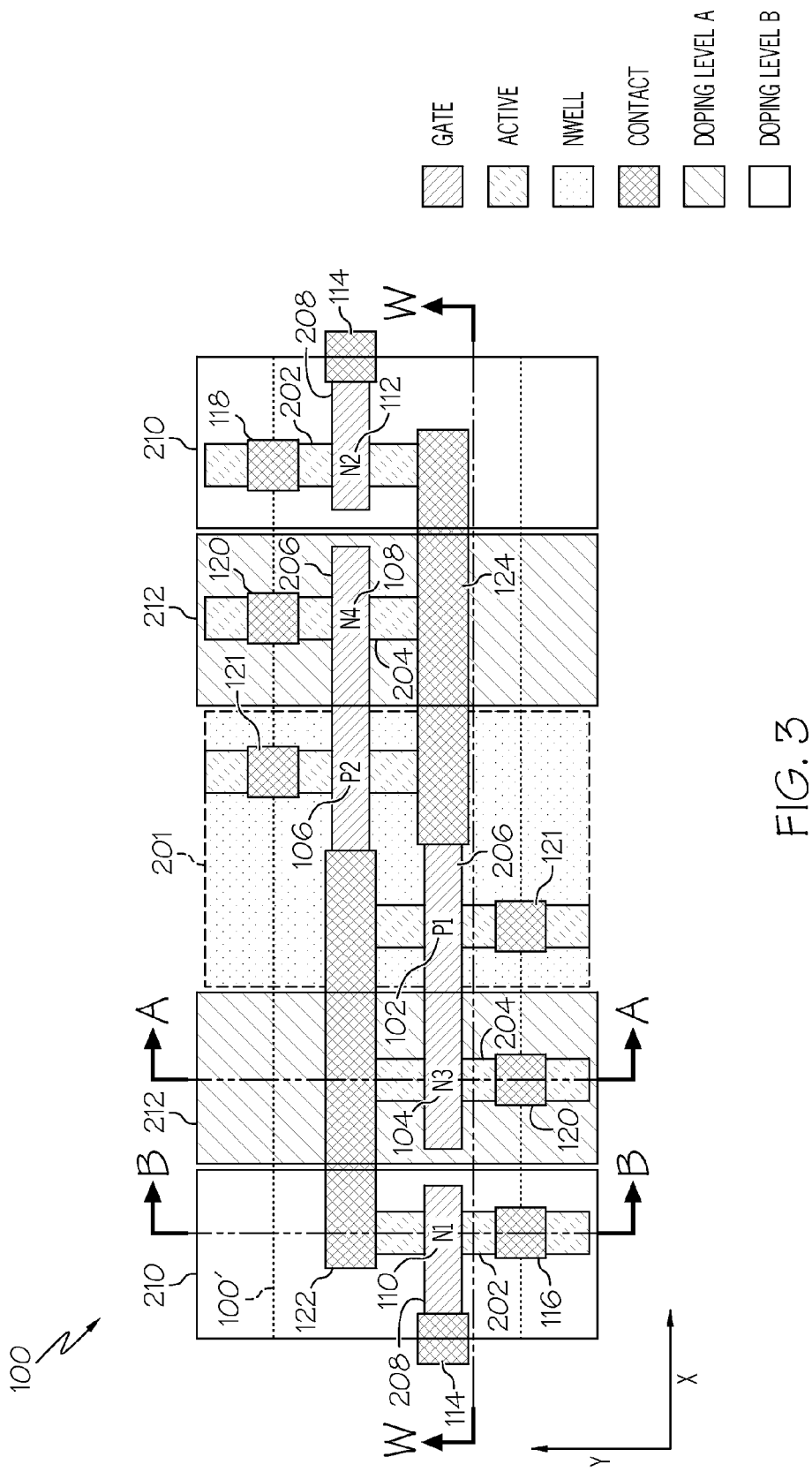
FIG. 3 is a layout view illustrating a topology for the 6T SRAM cell of FIG. 1 in accordance with exemplary embodiments.

Referring now to FIG. 3, the SRAM cell 100 (FIG. 1) is illustrated in layout view depicting cell boundary 100' and the topology of exemplary embodiments of the present disclosure. For convenience of comparison to the conventional topology (see FIG. 2) like reference numerals are shown. In exemplary embodiments, the SRAM cell 100 may be formed in a silicon layer over a buried oxide layer (or other insulating layer) of a substrate. Also, as illustrated in FIG. 3, exemplary embodiments of the present disclosure print all lines along a single axis (the x axis) without any orthogonal printing (the y axis) as in conventional layouts. That is, the fabrication process of FIG. 3 employs a manufacturing process using a unidirectional (printing in one direction) process, that is jogless (no corners or right angles in the active area masks) and having iso-dimensional (same size lines) structures to complete the fabrication of the SRAM cell 100. The preferred fabrication process produces a SRAM topology where the passgate transistors (110 and 112) are linearly aligned (along the x axis) with the pull-down transistors (104 and 108) and the pull-up transistors (102 and 106) of the respective inverters. Also, the common gates 206 of the inverters are aligned with the shared contacts 122 and 124 that form the cell node of the cross-coupled inverter. This arrangement reduces the cell boundary 100' in the direction of the complementary bit lines 116 and 118 (along the y axis). The passgate transistors 110 and 112 also have a gate contact 208 linearly aligned with the common gate of the respective inverters and positioned on the perimeter of the SRAM cell 100 adjacent to their respective pull-down NFETs 104 and 108.

The pull-up PFET devices 102 and 106 are formed using conventional fabrication processes with the well-doping 201 formed in the substrate layer under the buried oxide layer (not shown in FIG. 3) as will be understood by those skilled in the art. However, due to the linear alignment of the pull-down transistors (104 and 108) and the passgate transistors (110 and 112), different doping levels can also be formed below the buried oxide layer (or other insulating layer) in regions 210 and 212 beneath each of the passgate transistors (110 and 112) and the pull-down transistors (104 and 108). The doping levels below the buried oxide layer (or other insulating layer) form a back-gate beneath the passgate transistors and the pull-down transistors, and independent voltages can be applied to these two back-gates. Due to the thickness of the buried oxide layer, these backgates offer the ability to independently influence the threshold voltages of the passgate transistors (110 and 112) and the pull-down transistors (104 and 108) and pull-up transistors (102 and 106). Thus, when an active bias is applied to these backgates, improvements in switching speed and controlling leakage current of the NFET devices can be achieved for write and read/standby conditions.

Figure 4:
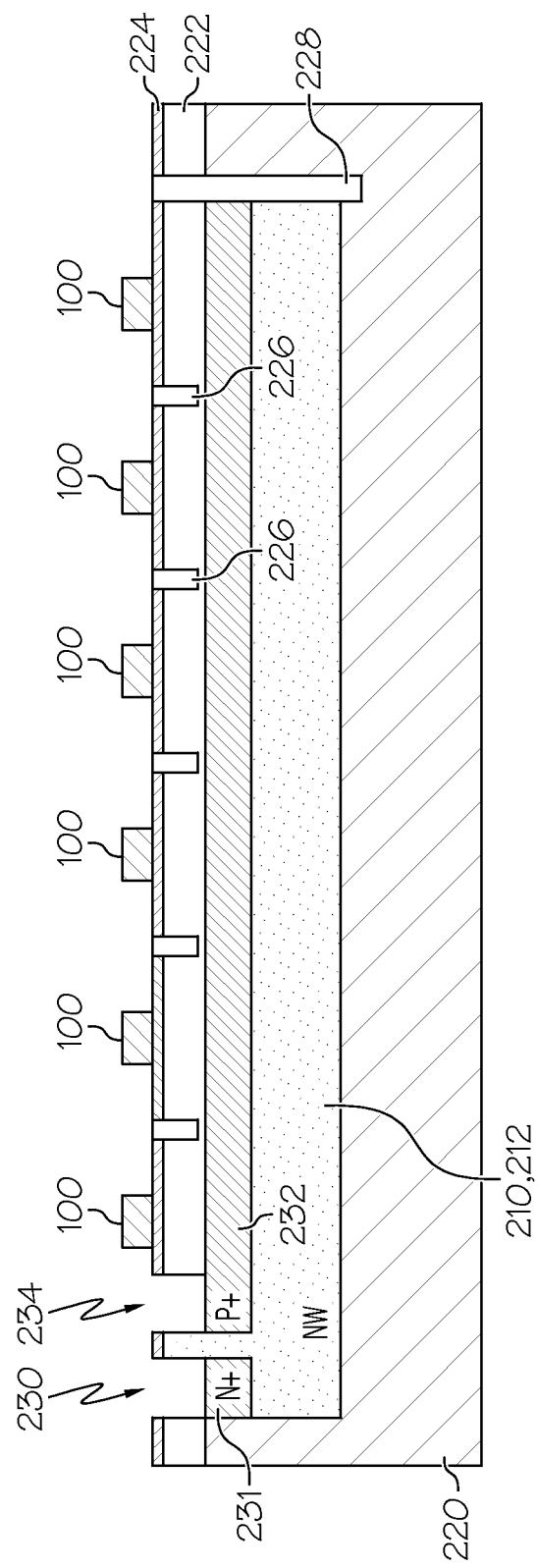
FIG. 4 is a cross-sectional view taken along the A-A or B-B section line of FIG. 3 that illustrates exemplary embodiments of the present disclosure.

Referring now to FIG. 4, wherein like numerals denote like elements, there is shown a cross-sectional view of a substrate upon which a plurality of SRAM cells 100 (six shown) have been formed. FIG. 4 is illustrated cut in the bit line direction (the y axis of FIG. 3) to show the substrate 220 upon which a buried oxide (BOX) layer (or other insulating layer) 222 has been formed that substantially covers the substrate 220. Accordingly to exemplary embodiments, the BOX layer 222 has a thickness of approximately 250 angstroms. A silicon layer 224 is formed over the BOX layer 222 providing a conventional silicon-on-insulator arrangement. Typically, the silicon layer 224 is approximately six-to-seven nanometers in thickness.

The sub-BOX backgate is configured below the NFET and PFET devices of the SRAM cell 100. The backgate includes P+ region 232 below the BOX layer 222 for the NFET devices. Below the P+ region 232, an N-Well is formed within the substrate 220. If, for example, the cross-section of FIG. 4 were cut along section line B-B of FIG. 3 the sub-BOX N-well 210 would be doped at the level for the passgate transistor 110. Alternately, if the cross-section were taken along section line A-A of FIG. 3, the sub-BOX N-well 212 would be doped at the level for the pull-down transistor 104. This configuration forms independent backgates below the BOX layer that may be at different doping levels and different voltages (applied bias) to achieve greater control of device threshold voltage or leakage current for any particular implementation. Independent backgate influence of the NFET devices in this regard stems from the linear arrangement of the passgate devices and the pull-down devices previously discussed.

As illustrated in FIG. 4, between each SRAM cell 100 of the plurality of SRAM cells, shallow trench isolation 226 is formed between adjacent cells. In exemplary embodiments, the shallow trench isolation extends into the BOX layer 222, but not through it into the doped regions (e.g., the P+ region (232) or the N-well (210 or 212) below). At the end of the SRAM array formed by the plurality of SRAM cells 100, deep trench isolation 228 is used to isolate the SRAM array from other components or circuitry residing on the substrate 220. Accordingly to exemplary embodiments, deep trench isolation 228 extends as shown into the substrate 220 beyond the depth of the doped region (e.g., N-well), which prevents the static bias of the different doping levels 210, 212 and 232 from interfering with other components or systems. Also the deep trench isolation 228 isolates an active bias that may be dynamically and independently applied by other circuitry (not shown in FIG. 4) to a substrate contact 230 (coupled to the N-Well 210 via an N+ region 231 to provide an effective ohmic contact). Also an active bias may be applied directly to the P+ region 232 via back-gate contact 234. These contacts are typically placed at the end of a column of a plurality of SRAM cells 100, which affords active individual backgate bias control of the passgate transistors 110 and 112 independent of the pull-down transistors 104 and 108.

Figure 5:
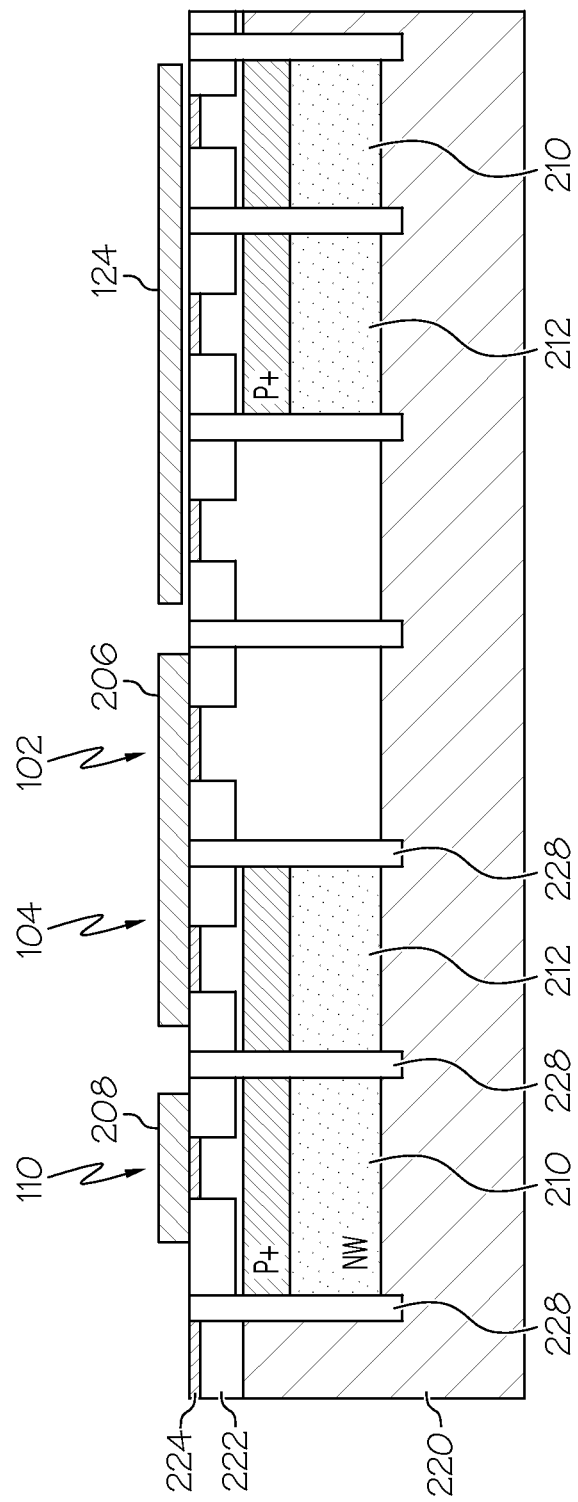
FIG. 5 is a cross-sectional view taken along the W-W section line of FIG. 3 that illustrates exemplary embodiments of the present disclosure.

Referring now to FIG. 5, wherein like numerals denote like elements, there is shown a cross-sectional view of one of the plurality of SRAM cells 100 of FIG. 4. FIG. 5 is illustrated cut in the word line direction (across section line W-W of FIG. 3) to show the substrate 220 upon which a buried oxide (BOX) layer (or other insulating layer) 222 has been formed that substantially covers the substrate 220. A thin silicon layer 224 is formed over the BOX layer 222 providing a conventional silicon-on-insulator arrangement. The cross-section of FIG. 5 also illustrates the different doping levels 210 and 212 formed beneath the BOX layer 222 for the passgate transistor 110 and the pull-down transistor 104, which are linearly aligned on the substrate. Also shown is the shared contact of the cell node 124 of the cross-coupled inverter residing behind the cell node 124 in this cross-sectional view. Between each device (including the pull-up transistors 102 and 106), exemplary embodiments utilize deep trench isolation 228 between adjacent devices so that the differing doping levels and biases may be individually controlled and used for the operational advantage of the SRAM cell 100.

Figure 6:
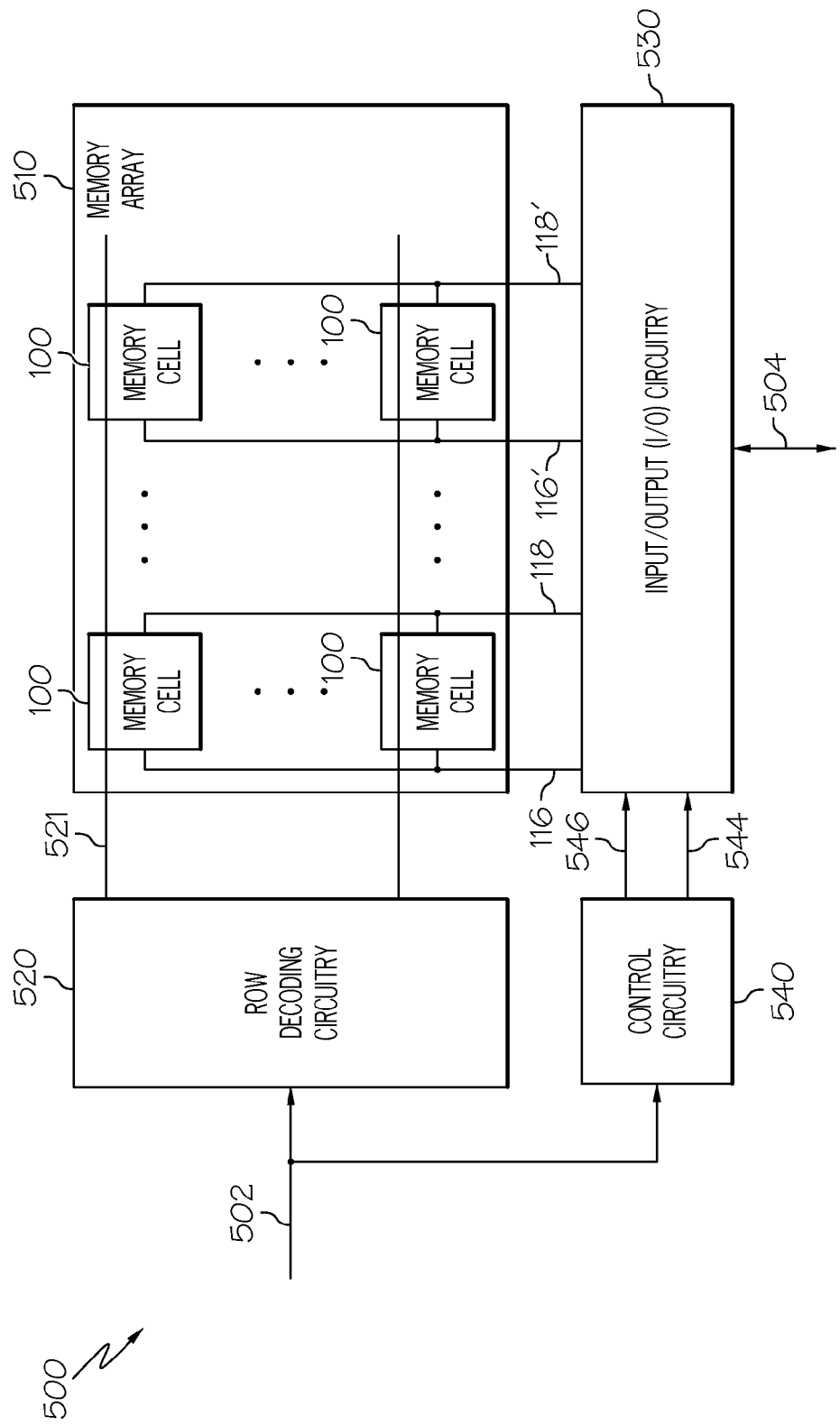
FIG. 6 is an illustration of the 6T SRAM cell of FIG. 3 arranged into an SRAM array according to exemplary embodiments of the present disclosure.

Referring now to FIG. 6, wherein like numerals denote like elements, the SRAM cell 100 (FIG. 1) is illustrated formed into a memory device 500. In one embodiment, the memory device 500 includes a memory array 510, row decoding circuitry 520, input/output (I/O) circuitry 530, and control circuitry 540. The memory array 510 includes multiple rows and multiple columns of memory cells, any suitable one or more of which may be a memory cell such as SRAM cell 100 (FIG. 1). As illustrated, the row decoding circuitry 520 is coupled to receive at least a portion of an address on address lines 502 and to generate a signal on a word line, such as a word line 521 for example, to select memory cells in a row of memory array 510 in response to the received address portion. For comparison to FIG. 1, the word line 521 corresponds to WL 114 of FIG. 1. Row decoding circuitry 520 generates a high voltage signal on a word line to activate the passgates (110 and 112 of FIG. 3) of memory cells 100 in a row of memory array 510. A single pair of complementary bit lines (116 and 118) is common to multiple memory cells in one column of memory array 510 as shown. The I/O circuitry 530 generally includes one or more sense amplifiers. A sense amplifier senses the complementary signals on a select bit line pair of multiple bit line pairs (116/118 and 116'/118') corresponding to multiple columns of memory array 510 and outputs on one or more data lines 504 corresponding amplified complementary signals or an amplified signal representative of a binary value corresponding to the sensed complementary signals. The I/O circuitry 530 also includes one or more write drivers that receive a signal or complementary signals representative of a binary value on one or more data lines 504 to assert corresponding complementary signals on a select bit line pair (116/118 and 116'/118') of multiple bit line pairs corresponding to multiple columns of memory array 510. The control circuitry 540 also receives at least a portion of the address 502 and generates one or more pre-charge signals 544 that apply the active bias to the various substrate contacts (230 of FIG. 4) of the array 510, as well as column select lines 546 to select memory cells in one or more columns of memory array 510 in response to the received address portion. In this way, several (potentially hundreds of millions) SRAM cells 100 of the present disclosure can be arrayed to form an SRAM memory device 500 for use in computing or other applications.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the disclosure in any way. Rather, the foregoing detailed description will provide those skilled in the art with a convenient road map for implementing the exemplary embodiments. It should be understood that various changes can be made in the size, spacing, applied voltages and doping of elements without departing from the scope of the disclosure as set forth in the appended claims and the legal equivalents thereof.

What is claimed is:

1. A static random access memory cell formed on a substrate and including first and second inverters each having a pull-up and pull-down transistor configured to form a cell node, comprising:
    each of the pull-down transistors of the first and second inverters formed in a silicon layer and over first regions of the substrate having a first doping level and applied bias providing a first voltage threshold for the pull-down transistors; and
    a pair of passgate transistors having a drain respectively coupled the cell nodes of the first and second inverters and arranged such that the passgate transistor of the first inverter has a gate contact formed to align with the cell node of the second inverter and the passgate transistor of the second inverter has a gate contact formed to align with the cell node of the first inverter, and each passgate transistor being formed in the silicon layer and over second regions of the substrate having a second doping level and applied bias providing a second voltage threshold for the passgate transistors, the first voltage threshold differing from the second voltage threshold providing voltage threshold control between the pull-down transistors and the passgate transistors.

2. The random access memory cell of claim 1, further comprising the passgate transistors each having a source contact coupled to one of a complementary pair of bit lines.

3. The random access memory cell of claim 1, further comprising the gate of each of the passgates transistors coupled to a word line.

4. The random access memory cell of claim 1, further comprising the first and second regions of the substrate formed under a insulating layer substantially covering the substrate.

5. The random access memory cell of claim 4, further comprising a plurality of other random access memory cells arranged into an array each having a shallow trench isolation barrier extending into a buried oxide layer between adjacent cells.

6. The random access memory cell of claim 5, further comprising a deep trench isolation barrier extending below a doped layer at one end of the array.

7. The random access memory cell of claim 6, further comprising a bias contact coupled to the doped layer at an opposite end of the array.

8. The random access memory cell of claim 1, further comprising the passgate transistor of the first inverter having a gate contact linearly aligned with gate contacts of the pull-up and pull-down transistors of the first inverter and the passgate transistor of the second inverter having a gate contact linearly aligned with gate contacts of the pull-up and pull-down transistors of the second inverter.

9. The random access memory cell of claim 8, further comprising deep trench isolation barriers extending below an N-well area of the substrate between each of the first passgate transistor and the pull-up and pull-down transistors of the first inverter and between each of the second passgate transistor and the pull-up and pull-down transistors of the second inverter.

10. A static random access memory cell formed over an insulating layer of a substrate, comprising:
    a pair of P channel field effect transistors (PFET), each of the PFETs having a common source connected to a voltage potential and a gate connected to a drain of the other PFET;
    a first pair of N channel field effect transistors (NFET) formed over a first substrate doping level below the insulating layer, each of the NFETs having a drain connected to the drain of the respective PFET of the pair of PFETs, a common source connected to a reference potential, and a gate connected to the drain of an opposite PFET of the pair of PFETs; and
    a second pair of passgate NFETs formed over a second substrate doping level below the insulating layer, and having the drain respectively connected to a cell node linking the respective drain of the NFET of the first pair of NFETs to the drain of the PFET of the pair of PFETs, and further having the gate contact of the passgate NFET of the first inverter formed to align with the cell node of the second inverter and the gate contact of the passgate NFET of the second inverter formed to align with the cell node of the first inverter, the first substrate doping level and applied bias providing a first voltage threshold for the first pair of NFETs and the second substrate doping level and applied bias providing a second voltage threshold for the second pair of NFETs being different from the first voltage threshold.

11. The random access memory cell of claim 10, further comprising each of the second pair of NFETs having a gate coupled to a word line.

12. The random access memory cell of claim 11, further comprising each of the second pair of NFETs having a source coupled to one of a complementary pair of bit lines.

13. The random access memory cell of claim 12, further comprising a plurality of other random access memory cells arranged in rows to form an array, each row of the array having an individual word line and each column of the array coupled to an individual pair of complementary bit lines.

14. The random access memory cell of claim 13, further comprising shallow trench isolation extending into the insulating layer substantially covering the substrate between each cell of the array.

15. The random access memory cell of claim 14, further comprising deep trench isolation extending below a doped layer of the substrate at one end of the array.

16. The random access memory cell of claim 15, further comprising a bias contract coupled below the insulating layer to a doped layer at an opposite end of the array.

17. The random access memory cell of claim 10, further comprising each of the second pair of NFETs being linearly aligned with one of the first pair of NFETs and one of the pair of PFETs.

18. The random access memory cell of claim 17, further comprising deep trench isolation extending below a doped layer between each of the pair of PFETS and the first and second pair of NFETs.

19. A method of fabricating a static random access memory cell, comprising:
 forming a first P channel field effect transistor (PFET) over an N-well area of a substrate;
 forming a first N channel field effect transistor (NFET) over a region of the substrate having a first doping level below an insulating layer substantially covering the substrate, the first PFET and the first NFET having a first shared contact forming a first cell node and a first common gate forming a first inverter;
 forming a second PFET over the N-well area of the substrate;
 forming a second NFET over another region of the substrate having the first doping level below the insulating layer, the second PFET and the second NFET having a second shared contact forming a second cell node and a second common gate forming a second inverter cross-coupled to the first inverter; and
 forming a pair of passgate transistors in linear alignment to one of the first and second NFETs and configured such that the passgate transistor of the first inverter has a gate contact formed to align with the cell node of the second inverter and the passgate transistor of the second inverter has a gate contact formed to align with the cell node of the first inverter, each of the pair of passgate transistors formed over second regions of the substrate having a second doping level below the insulating layer, each of the pair of passgate transistors coupled to one of the first shared contact or the second shared contact to form the static random access memory cell.

* * * * *